March 22, 1960 J. J. LOFERSKI 2,929,859

SEMICONDUCTOR DEVICES

Filed March 12, 1957

INVENTOR.
JOSEPH J. LOFERSKI
BY J. L. Whittaker
ATTORNEY 2,929,859

SEMICONDUCTOR DEVICES

Joseph J. Loferski, Hamilton Square, N.J., assignor to Radio Corporation of America, a corporation of Delaware Application March 12, 1957, Serial No. 645,511

15 Claims. (Cl. 136—89)

This invention relates to improved semiconductor devices. More particularly, the invention relates to improved devices utilizing compound semiconductive materials.

In the art of making electrical devices such as transistors, the semiconductive materials most often used are elemental germanium and silicon. Certain solid binary compounds also exhibit useful semiconductive properties. Examples are the phosphides, arsenides and antimonides of aluminum, gallium and indium. This group is known as the III—V compounds because the constituents are elements from those columns of the periodic table. Other useful semiconductive compounds are the sulfides, selenides and tellurides of zinc, cadmium and mercury. This group is known as the II—VI compounds because its constituents are elements from those columns of the periodic table. These binary semiconductive compounds have certain advantages over conventional materials such as silicon and germanium. The mobility of negative charge carriers is usually much greater in these compounds than it is in germanium or silicon. However, it has been found diffcult to fabricate satisfactory solar batteries, rectifiers, and transistors of these compound semiconductors, since when heated, the more volatile constituent vaporizes and the compound may begin to decompose at a temperature considerably below the melting point.

If a transistor is made in which the emitter semiconductive material has a higher bandgap than the base semiconductive material, the unit has an emitter efficiency which is greater than that available when the emitter-base rectifying barrier is formed by homogeneous bandgap materials. See for example article by H. Kroemer, "Zur Theorie des Diffusions und des Drift-Transistors III," A.E.V. 8 (1954), 499–504. The band-gap is the forbidden energy gap between the valence band and the conduction band of the semiconductor. The band-gap or energy gap is also interpreted as the electron ionization potential, or the additional energy which must be given to an electron in the valence band to elevate the electron to the conduction band.

An object of this invention is to provide improved semiconductor devices utilizing compound semiconductors.

Another object of this invention is to provide improved semiconductor devices utilizing III—V and II—VI compounds.

But another object of this invention is to provide improved solar batteries.

Still another object of this invention is to provide a new and improved type of rectifier.

Yet another object of this invention is to provide an improved type of transistor having an emitter with a higher bandgap than the base region.

These and other objects of the invention are accomplished by immersing a monocrystalline semiconductive compound wafer in an atmosphere of an element which has the ability to combine with the less volatile wafer constituent. The element is selected from the same column of the periodic table as the more volatile wafer constituent, and does not alter the conductivity type of the wafer compound. A thin surface layer of the wafer is thus converted to a second semiconductive compound composed of the less volatile wafer constituent and the ambient element. By the selection of appropriate materials the surface layer formed has a higher energy gap than the original wafer. The resulting structure may be utilized to make improved solar batteries, rectifying diodes, and improved transistors having the advantages of a high energy gap emitter.

As an illustrative example, the semiconductive compound wafer may consist of gallium arsenide. The more volatile constituent of this compound is arsensic. According to this invention, the wafer is heated in an ambient atmosphere selected from the arsenic-containing column of the periodic table. The element selected must combine with the less volatile constituent of the compound, in this example with the gallium. Suitable elements for the ambient atmosphere are therefore phosphorus or antimony. Since gallium phosphide has a higher bandgap than gallium arsenide, phosphorus is preferred as the ambient.

The invention and its advantages will be described in greater detail with reference to the accompanying drawing, in which Figures 1A–1D are cross-sectional schematic views of successive steps in the fabrication of a rectifying diode having the structure and features hereinbefore mentioned;

Similar reference characters are applied to similar elements throughout the drawing.

Figure 1:
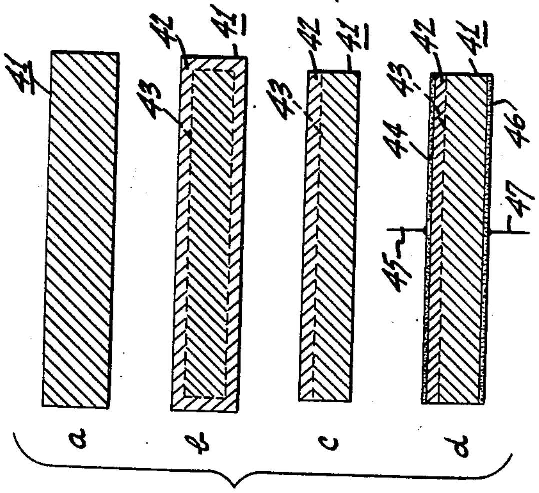

Referring to Figure 1A, a wafer 41 is prepared from a monocrystalline ingot of a purified III—V or II—VI compound. In this example, the material used is P-conductivity type aluminum antimonide. The exact size of the wafer is not critical. For example, a suitable wafer may be about 100 mils in diameter and 10 mils thick. In aluminum antimonide, as in all the III—V and II—VI compounds, one of the constituent elements is more volatile than the other. In this example, antimony has a boiling point of about 1380° C., while aluminum boils at 2270° C. As mentioned above, this disparity in the vapor pressures of the compound constituents is a problem in device fabrication, since it is usually necessary to heat the semiconductive compound during processing. When heat treated, these materials lose the more volatile constituent by evaporation, and become non-stoichiometric, frequently changing in conductivity type. Depending on the compounds and the heating profile used, the materials may even decompose below the melting point. Hence these compounds have been heat treated in an atmosphere of the volatile constituent so that decomposition of the compound is minimized.

According to this invention, the aluminum antimonide is heated in an atmosphere of another element from the same column of the periodic table as the more volatile constituent of the compound. In this example, the antimony is the more volatile constituent, hence the element for the ambient atmosphere is selected from the antimony-containing column V of the periodic table. Thus phosphorus or arsenic may be used for the ambient atmosphere in this case. The element selected is one which will combine with the less volatile constituent of the wafer to form another semiconductive compound. Preferably the element selected is one which will yield a compound having a higher energy gap than the original material. In this example, a suitable element is arsenic, since it combines with the less volatile aluminum to form aluminum arsenide. The energy gap of aluminum antimonide is 1.6 electron volts, while the energy gap of aluminum arsenside is 2.4 electron volts. The diffusion parameters for semiconductive compounds are similar to those for germanium and silicon, in that in all cases, the temperature and time of heating depends on the specific semiconductor used, the wafer thickness, the volatility of the ambient element, and the diffusion constant of the element in the semiconductor.

Referring to Figure 1B of the drawing, some of the antimony vaporizes from the surface of the wafer 41 and is replaced by the ambient arsenic, thus forming a surface layer 42 of aluminum arsenide. The transition between the original bulk of the wafer and the surface layer formed will not be abrupt. In some cases a part of the original compound will remain in the layer, so that the layer is a mixture, but the bandgap increases from the bulk to the surface, and the bandgap of the mixture is always higher than that of the bulk. The surface layer 42 is next converted to conductivity type opposite that of the bulk of the wafer by diffusing a suitable impurity therein. In this example, the conversion is accomplished by heating the wafer 41 in an atmosphere of sulfur. The temperature and duration of heating will depend on the thickness of the wafer and the depth of the surface layer 42. A P–N junction 43 is formed at the interface of the P-conductivity bulk of the wafer and the N-type layer 42.

One major surface of the wafer 41 is then covered with a resist such as lacquer or polystyrene, and the wafer is immersed in an etchant. In this example, a suitable etchant is composed of equal volumes of concentrated nitric and concentrated hydrochloric acid. This composition may be used for all III—V compounds. The etching step removes the N-conductivity type aluminum arsenide layer 42 from all the surfaces of the wafer which were not covered by the resist. The resist is then removed by a suitable solvent, such as toluol for polystyrene, leaving the wafer as shown in Figure 1C. Alternatively, the aluminum arsenide layer 42 may be removed from the desired surfaces by lapping or grinding.

Referring to Figure 1D, large area ohmic contacts are made on the two major surfaces of the wafer 41. One method of accomplishing this is to cover the two wafer surfaces with films 44 and 46 of a metal that will not affect the conductivity type of the wafer. In this example, a suitable metal is indium. The two major wafer surfaces are plated with indium and the wafer is then heated so that a good ohmic contact is formed between the indium films 44 and 46, and the semiconductor wafer 41. Leads 45 and 47 are then attached to the films 44 and 46 respectively, thus completing the device. The resulting aluminum antimonide-aluminum arsenide diode has a reverse saturation current smaller by a factor of two than conventional diodes made of aluminum arsenide alone.

The factor of two is derived as follows. The reverse saturation current, $I_o$, which is the thermally generated minority carrier current across the junction, is equal to the sum of the hole current $I_{op}$, and the electron current, $I_{on}$.

$$I_o=I_{op}+I_{on}$$

The electron current, $I_{on}$, and the hole current, $I_{op}$, are both proportional to $$e^{-\frac{E_g}{kT}}$$

At room temperature, $$e^{-\frac{E_g}{kT}}=e^{-40E_g}$$

If both the N and the P materials are the same, for example if both are aluminum arsenide, then they have the same energy gap, so $$E_{gn}=E_{gp}$$

and $$I_{on}=I_{op}$$

hence $$I_o=2I_{on}=2I_{op}$$

If the N and P materials differ, their energy gaps are unequal. Assume that $E_{gn}$ is greater than $E_{gp}$, as in the present example of an N-type aluminum arsenide layer on a P-type aluminum antimonide wafer. It can then be demonstrated that $I_{on}$ is much smaller than $I_{op}$. Consider the present example, where $E_{gn}$ is 2.4 electron volts, while $E_{gp}$ is 1.6 electron volts. $I_{on}$ will be proportional to $e^{-40(2.4)}$, while $I_{op}$ will be proportional to $e^{-40(1.6)}$. It follows that $$\frac{I_{on}}{I_{op}}=\frac{e^{-96}}{e^{-64}}=e^{-32}=\frac{1}{7.9\times10^{13}}$$

The above calculation assumes that the doping and the lifetimes on both sides of the P–N junction are equal. However, the expected deviations from equality would not affect the value of the ratio of $I_{on}$ to $I_{op}$ by more than a few orders of magnitude, so that $I_{op}$ would still remain much larger than $I_{on}$. Thus $I_{on}$ is so small in comparison with $I_{op}$ that it may be neglected. Hence the reverse saturation current, $I_o$, may be considered equal to $I_{op}$ in this case, and is therefore only half the value when both materials are aluminum arsenide, since in the latter case $I_o$ equals $2I_{op}$.

Rectifying diodes may also be fabricated beginning with a zinc-doped P-conductivity type wafer of indium phosphide. Since phosphorus is the more volatile constituent of the wafer, the ambient atmosphere used is arsenic, which is in the phosphorus-containing column of the periodic table. A layer of indium arsenide is formed, which is doped with selenium so as to be of N-conductivity type. Ohmic connections are then made to the P-type indium phosphide body and the N-type indium arsenide layer.

The method is not restricted to wafers of P-conductivity type. For example, a bromine-doped N-conductivity type mercuric selenide wafer may be utilized as the starting material. Since the more volatile constituent is mercury, the wafer is heated in an ambient selected from the mercury-containing column of the periodic table. In this example, cadmium may be used as the ambient to form a surface layer of cadmium selenide on the wafer. The cadmium selenide layer may be converted to P-conductivity type by doping it with potassium. Ohmic connections to the N-type body and the P-type layer then complete the device.

Another embodiment of the invention is shown in Figures 2A–2E, which represent successive steps in the fabrication of a solar battery.

Figure 2:
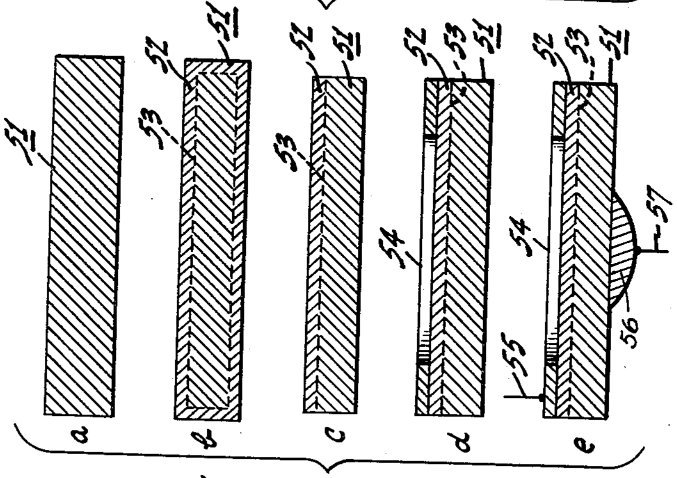
Figures 2A–2E are cross-sectional schematic views of successive steps in the fabrication of a solar battery according to the invention.

Referring to Figure 2A, a wafer 51 is prepared from a monocrystalline ingot of a purified III—V or II—VI compound. In this example, the material used is iodine doped N-conductivity type cadmium telluride. Cadmium has a boiling point of about 767° C., while tellurium boils at 1390° C., hence, cadmium is the more volatile constituent. According to the invention, the wafer 51 is heated in an atmosphere selected from the elements of the cadmium-containing column of the periodic table, such as zinc and mercury. In this example, a suitable element is zinc, since it combines with the less volatile tellurium to form zinc telluride. The energy gap of cadmium telluride is 1.45 electron volts, while the energy gap of zinc telluride is about 2 electron volts.

Referring to Figure 2B of the drawing, some of cadmium vaporizes from the surface of the wafer 51 and is replaced by the ambient zinc, thus forming a surface layer 52 of zinc telluride on the wafer. This surface layer 52 is next converted to conductivity type opposite to that of the bulk of the wafer by diffusing a suitable impurity therein. A column I element such as lithium, or a column V element such as arsenic is a suitable impurity for converting the zinc telluride layer 52 to P-conductivity type. In this example, the conversion is accomplished by heating the wafer 51 in an atmosphere of sodium. A P–N junction 53 is formed at the interface of the P-type zinc telluride layer 52 and the N-type cadmium telluride bulk of the wafer 51.

Referring to Figure 2C, the zinc telluride layer 52 is left on one major surface of the wafer, but removed from all the other surfaces by lapping or grinding or etching, as described above, leaving the wafer as shown in Figure 2C. A suitable etchant for cadmium telluride and the other II—VI compounds is distilled nitric acid at 30° C. for two minutes, followed by a boiling solution of 10% sodium hydroxide and 10% sodium dithionite.

Referring to Figure 2D, an ohmic contact is made to the zinc telluride layer 52. One method of fabricating the ohmic contact is to surface alloy a material that does not affect the conductivity type of the semiconductive compounds. In this example, a nickel ring of about 100 mils outer diameter and 10 mils wide is coated with an alloy of 90 lead—10 antimony. The ring 54 is placed on the layer 52 and is heated so as to alloy it to the wafer. The contact between the coated ring electrode 54 and the P-type zinc telluride layer 52 is of ohmic character.

Referring to Figure 2E, a large area indium electrode pellet 56 is alloyed to the wafer 51 on the surface opposite the ring 54. The contact between the indium electrode 56 and the N-type cadmium telluride is also ohmic. Leads 55 and 57 are then attached to the electrodes 54 and 56 respectively, thus completing the device. The resulting structure is a photovoltaic device of the type known as a solar battery. It is more efficient than conventional devices because the high energy gap layer 52 permits a portion of the incident light to reach the P–N junction 53, where the loss of generated minority carriers is minimized.

The efficiency of a solar battery of this type is increased because as explained above, the reverse saturation current is reduced by the layer of high energy gap material, and the efficiency of a photovoltaic P–N junction device depends on the ratio of the minority carriers reaching the junction to the thermally generated minority carrier current across the junction. The increased efficiency can be derived as follows. The efficiency of a solar battery using materials of the same energy gap is proportional to $$\frac{kT}{q} \ln \frac{I_s}{I_o}$$

where $q$ is the electronic charge, $I_s$ is the short circuit current across the junction which is caused by incident light, and $I_o$ is the thermally generated minority carrier current across the junction. The efficiency of a solar battery using materials of different energy gap is also proportional to $$\frac{kT}{q} \ln \frac{I_s}{I_o}$$

For the reasons discussed above, in the first case $$I_o = I_{on} + I_{op} = 2I_{on}$$

while in the second case $I_o = I_{on}$. Hence the denominator of the antilog in the first case is twice that in the second case. The efficiency in the latter case is therefore increased.

It will be appreciated by those skilled in the art that although the solar battery has been described in terms of N-conductivity type cadmium telluride as substrate, the invention may also be practiced with III—V compounds such as indium arsenide and gallium arsenide, as well as other II—VI compounds such as mercuric selenide. It will also be understood that analogous devices can be made beginning with wafers of either conductivity type. Compounds of the III—V group may be doped with zinc, cadmium, or mercury to become P-type, or if already P-type, they may be doped with sulfur, selenium, or tellurium to become N-type. Compounds of the II—VI group may be doped with bromine, iodine, indium, or gallium if N-type conductivity is desired, or may be converted to P-conductivity type by doping with sodium, potassium, arsenic, or antimony.

A solar battery may be prepared beginning with a P-conductivity type substrate. For example, a cadmium-doped P-conductivity type gallium arsenide wafer may be employed. Since arsenic is the more volatile constituent, the wafer is heated in an ambient from the arsenic-containing column of the periodic table. In this example, a suitable ambient is antimony. The gallium antimonide layer formed on the surface of the wafer is converted to N-conductivity type by doping it with tellurium. To complete the device, ohmic electrodes are attached to the P-type wafer and the N-type layer as described above.

Another embodiment of the invention is shown in Figures 3A–3E, which represent successive steps in the fabrication of a transistor.

Figure 3:
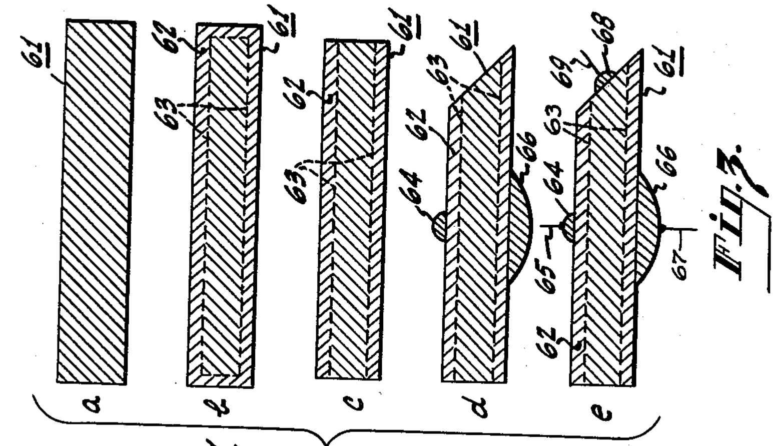
Figures 3A–3F are cross-sectional schematic views of successive steps in the fabrication of a transistor having the structure and features hereinbefore mentioned.

Referring to Figure 3A, a wafer 61 of monocrystalline gallium arsenide is prepared from a P-conductivity type ingot. The more volatile constituent is arsenic. The wafer 61 is therefore treated in an atmosphere of another element from the arsenic-containing column of the periodic table. In this example, the wafer 61 is heated in an atmosphere of phosphorus.

Referring to Figure 3B, some of the arsenic evaporates from the surface of the gallium arsenide wafer 61, and is replaced by the ambient phosphorus, forming a layer 62 of gallium phosphide on the wafer. The energy gap of gallium arsenide is 1.35 electron volts, while the energy gap of gallium phosphide is 2.4 electron volts. The wafer 61 is then heated in vapors of selenium to convert the layer 62 to N-conductivity type. A P–N junction 63 is formed between the bulk of the wafer 61 and the N-type layer 62.

The layer 62 is removed from the minor surfaces of the wafer by lapping or grinding or etching, leaving the wafer with a P–N junction below two opposite major surfaces, as shown in Figure 3C.

Referring to Figure 3D, the wafer is cut at a shallow angle to one major surface so as to expose a greater area of the central P-type zone which serves as the base region. An emitter electrode connection 64 having substantially ohmic properties is made by surface alloying an indium pellet to the gallium phosphide layer on one major surface. A collector electrode connection 66 is prepared by surface alloying a larger indium pellet coaxially opposite the emitter 64. The two steps may be performed simultaneously if desired.

Referring to Figure 3E, the unit is etched, washed in deionized water and a base connection 68 also having substantially ohmic properties is made by surface alloying a smaller indium pellet to the P-type exposed base region. Electrical leads 65, 67 and 69 are then connected to the emitter electrode connection 64, the collector connection 66, and the base electrode 68 respectively. Transistors made by this method have an emitter region of greater energy gap than the base region, and therefore have the advantage of improved emitter efficiency. The improved emitter efficiency accrues because the higher bandgap in the emitter region increases the height of the barrier which the majority carriers in the base have to overcome in order to enter the emitter region, while the barrier for minority carrier injection into the base remains unchanged.

Various modifications of the above method of fabrication may be made within the scope and spirit of the invention. For example, in the manufacture of transistors as described above, the source of the ambient phosphorus atmosphere may be a wafer of indium phosphide. When indium phosphide is heated, the more volatile phosphorus evaporates before the indium. Thus a wafer of gallium arsenide may be heated together with a wafer of indium phosphide in an evacuated furnace. The indium phosphide serves as a source of very pure phosphorus vapors. More important, some of the arsenic vapors given off by the gallium arsenide will diffuse into the phosphorus-deficient indium phosphide and form a mixed layer of indium arsenide and indium phosphide at the same time that a layer of gallium phosphide is being formed on the gallium arsenide wafer. Thus two wafers are treated simultaneously, although in the second wafer the bandgap of the indium arsenide-containing surface layer is lower than that of the indium phosphide bulk.

Another modification of the methods described above is the introduction of an appropriate volatile doping agent when the wafer is being heated in an ambient atmosphere from the same column of the periodic table as the more volatile constituent of the wafer. In this manner the layer of higher bandgap material formed is suitably doped in the same operation.

Other combinations of semiconductive compounds may be utilized to make transistors. Aluminum antimonide transistors are desirable for reasons explained below, since they combine the advantages of high temperature operation and high charge carrier mobility. The more volatile constituent of the compound is antimony, hence a suitable ambient is an element from the antimony-containing column of the periodic table. For example, a zinc-doped P-conductivity type aluminum antimonide wafer is heated in an atmosphere of phosphorus to form a surface layer of aluminum phosphide. The wafer is then heated in vapors of tellurium to convert the aluminum phosphide layer to N-conductivity type. The wafer is subsequently treated as described in connection with Figures 3C–3E to form an NPN transistor.

An advantage in utilization at high temperatures accrues because this invention enables the successful use of compound semiconductors to fabricate improved transistors. Devices of this class which are made of germanium cannot operate at high temperatures. This temperature limitation is primarily a function of the energy gap or forbidden region between the valence band and the conduction band of the semiconductive material employed. When the temperature of a device of this class reaches a point where the thermal energy is sufficient to raise substantial numbers of electrons across the energy gap, the electrical characteristics of the semiconductive material are adversely affected. For example, the energy gap of germanium is about 0.7 electron volt, and most germanium semiconductive devices become inoperative above 80° C. This is a severe limitation for many applications. To overcome this, semiconductive materials with a larger energy gap are used, for example silicon with an energy gap of about 1.1 electron volts, since silicon devices can be successfully operated at higher ambient or dissipation temperatures.

If the energy gap of a semiconductor is too large, the material is similar to an insulator in its properties, and is useless for devices such as transistors. Some of the III—V and II—VI compounds mentioned above have the advantages of energy gaps which are higher than that of germanium or silicon, but still within the range of usefulness as a semiconductor. A representative compound semiconductor such as gallium arsenide has an energy gap of 1.35 electron volts. Hence a device employing semiconductive gallium arsenide can be operated at temperatures estimated to be as high as at least 300° C. The estimated magnitude of the energy gap in some of the other semiconductive compounds mentioned follows: indium phosphide, 1.25 electron volts; aluminum antimonide, 1.6 electron volts; gallium phosphide, 2.4 electron volts; aluminum arsenide, 2.4 electron volts; cadmium telluride, 1.45 electron volts; zinc telluride, 2.0 electron volts.

The primary properties of a pure semiconductor are determined not only by the width of the forbidden energy gap between the valence and conduction bands, but also by the mobility of the charge carriers in the materials. High mobility is particularly desirable for the minority charge carriers in devices such as transistors. The mobility of negative charge carriers (electrons) in germanium is about 3900 $cm.^2$/volt sec. The mobility of electrons in silicon is smaller, being about 1900 $cm.^2$/volt sec. Some of the compounds mentioned have considerably higher mobilities. For example, the mobility of electrons in gallium arsenide is 4000 $cm.^2$/volt sec.; in indium arsenide about 23,000 $cm.^2$/volt sec.; in indium antimonide, about 65,000 $cm.^2$/volt sec.; in indium phosphide, over 3400 $cm.^2$/volt sec. Semiconductors with high electron mobility are particularly suitable for NPN devices of the type shown in Figure 3F.

There have thus been described new and useful forms of semiconductor devices as well as methods for making these devices.

What is claimed is:

1. A large area rectifying junction semiconductor device including a body having a first region of a first semiconductive compound of given conductivity type, said compound being composed of two constituents having different degrees of volatility and selected from the group consisting of the phosphides, arsenides and antimonides of aluminum, gallium and indium and the sulfides, selenides and tellurides of zinc, cadmium and mercury, and a second region of opposite conductivity type in rectifying contact with said first region, said second region comprising a second semiconductive compound composed of the less volatile constituent of said first compound and another element from the same column of the periodic table as the more volatile constituent of said first compound.

2. A large area rectifying junction semiconductor device including a body having a first region of a first semiconductive material of given conductivity type, said material being a binary compound composed of one more volatile constituent and one less volatile constituent and selected from the group consisting of the phosphides, arsenides and antimonides of aluminum, gallium and indium and the sulfides, selenides and tellurides of zinc, cadmium and mercury, and a second region of opposite conductivity type in rectifying contact with said first region, said second region comprising a second semiconductive binary compound composed of the less volatile constituent of said first compound and another element from the same column of the periodic table as the more volatile constituent of said first compound.

3. A large area rectifying junction semiconductor device including a body having a first region of a first semiconductive compound of given conductivity type selected from the group consisting of the phosphides, arsenides, and antimonides of aluminum, gallium, and indium, and the sulffides, selenides, and tellurides of zinc, cadmium, and mercury, and a second region in rectifying contact with said first region, said second region being a semiconductive compound of opposite conductivity type composed of the less volatile constituent of said first compound and another element from the same group of elements in the column of the periodic table containing the more volatile constituent of said first compound.

4. A solar battery comprising a first region of given conductivity type composed of a first binary semiconductive compound and selected from the group consisting of the phosphides, arsenides and antimonides of aluminum, gallium and indium and the sulfides, selenides and tellurides of zinc, cadmium and mercury, a second region of opposite conductivity type in rectifying contact with said first region, said second region being composed of a second binary semiconductive compound composed of the less volatile constituent of said first compound and another element from the same column of the periodic table as the more volatile constituent of said first compound, and ohmic contacts to said first and second regions.

5. A rectifier comprising a first semiconductive layer of given conductivity type and a second semiconductive layer of opposite conductivity type in rectifying contact with said first layer, both said layers being binary compounds selected from the group consisting of the phosphides, arsenides, and antimonides of aluminum, gallium, and indium, and the sulfides, selenides, and tellurides of zinc, cadmium, and mercury, said second layer being composed of the less volatile constituent of said first layer and an element from the same group of elements in the column of the periodic table containing the more volatile constituent, and large area non-rectifying electrodes on each said layer.

6. A transistor comprising a given conductivity type base region, said base region being a semiconductive compound composed of one more volatile constituent and one less volatile constituent and selected from the group consisting of the phosphides, arsenides and antimonides of aluminum, gallium and indium and the sulfides, selenides and tellurides of zinc, cadmium and mercury, an emitter region in rectifying contact with said base region, said emitter region comprising a semiconductive compound composed of said less volatile constituent and another element from the same column of the periodic table as said more volatile constituent, and a collector electrode also in rectifying contact with said base region.

7. A transistor comprising a given conductivity type base region, an emitter region in rectifying contact with said base region, both said regions being composed of semiconductive compounds selected from the group consisting of the phosphides, arsenides, and antimonides of aluminum, gallium, and indium, and the sulfides, selenides, and tellurides of zinc, cadmium, and mercury, said emitter region comprising a compound composed of the less volatile constituent of the base region and another element from the same group of elements in the column of the periodic table containing the more volatile constituent, and a collector region also in rectifying contact with said base region.

8. A transistor comprising a semiconductive binary compound substrate of given conductivity type as base said compound being selected from the group consisting of the phosphides, arsenides and antimonides of aluminum, gallium and indium and the sulfides, selenides and tellurides of zinc, cadmium and mercury, and emitter electrode in rectifying contact with said base, said emitter electrode consisting of a semiconductive binary compound which has a higher energy gap than that of said base compound, said emitter compound being formed by the less volatile constituent of said base substrate and another element from the same column of the periodic table as the more volatile constituent of said base, and a collector electrode in rectifying contact with said base.

9. A rectifier comprising a body of P-conductivity type aluminum antimonide, a surface layer of N-conductivity type aluminum arsenide on said body, and large area non-rectifying electrodes on said body and said layer.

10. A rectifier comprising a body of N-conductivity type mercuric selenide, a surface layer of P-conductivity type cadmium selenide on said body, and large area non-rectifying electrodes on said body and said layer.

11. A rectifier comprising a body of P-conductivity type indium phosphide, a surface layer of N-conductivity type indium arsenide on said body, and large area non-rectifying electrodes on said body and said layer.

12. A solar battery comprising an N-conductivity type cadmium telluride substrate, a P-conductivity type zinc telluride layer in rectifying contact with said substrate, and ohmic contacts to said substrate and said layer.

13. A solar battery comprising a P-conductivity type gallium arsenide substrate, an N-conductivity type gallium antimonide layer in rectifying contact with said substrate, and ohmic contacts to said substrate and said layer.

14. A transistor comprising a substrate of P-conductivity type gallium arsenide as base, emitter and collector regions consisting of N-conductivity type gallium phosphide layers on said substrate, and leads ohmically attached to said regions.

15. A transistor comprising a substrate of P-conductivity type aluminum antimonide as base, emitter and collector regions consisting of N-conductivity type aluminum phosphide layers on said substrate, and leads ohmically attached to said emitter, collector and base.

References Cited in the file of this patent

UNITED STATES PATENTS

| | | |
|---|---|---|
| 2,688,564 | Forgue | Sept. 7, 1954 |
| 2,697,269 | Fuller | Dec. 21, 1954 |
| 2,759,861 | Collins | Aug. 21, 1956 |
| 2,788,381 | Baldwin | Apr. 9, 1957 |

OTHER REFERENCES

Lo, A. W. et al.: "Transistor Electronics," Prentice-Hall, Inc., Englewood Cliffs, N.J., 1955, pages 14–16.